United States Patent
Lee et al.

(10) Patent No.: US 7,692,446 B2
(45) Date of Patent: Apr. 6, 2010

(54) ON-DIE TERMINATION DEVICE

(75) Inventors: Geun-Il Lee, Kyoungki-do (KR); Chang-Kyu Choi, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/892,582

(22) Filed: Aug. 24, 2007

(65) Prior Publication Data

US 2008/0048714 A1 Feb. 28, 2008

(30) Foreign Application Priority Data

Aug. 24, 2006 (KR) .................. 10-2006-0080633
Mar. 30, 2007 (KR) .................. 10-2007-0031989
Apr. 2, 2007 (KR) .................. 10-2007-0032189

(51) Int. Cl.
*H03K 17/16* (2006.01)

(52) U.S. Cl. ............................................. 326/30

(58) Field of Classification Search ............ 326/26, 326/30, 82–87
See application file for complete search history.

(56) References Cited

U.S. PATENT DOCUMENTS 7,268,712 B1 * 9/2007 Sheen .................. 341/120

2005/0184823 A1 * 8/2005 Lee et al. .............. 333/17.3

FOREIGN PATENT DOCUMENTS

| KR | 10-2004-0062716 A | 7/2004 |
|----|-------------------|--------|
| KR | 2005-0019453      | 3/2005 |
| KR | 10-2005-0106907 A | 11/2005 |
| KR | 10-0681879        | 2/2007 |

OTHER PUBLICATIONS

Korean Notice of Allowance, w/ English translation thereof, issued in Korean Patent Application No. KR 10-2007-0031989 dated Oct. 28, 2008.

Japanese Notice of Allowance issued in Japanese Patent application No. KR 10-0032189 dated on Apr. 29, 2008.

* cited by examiner

*Primary Examiner*—Rexford N Barnie
*Assistant Examiner*—Thienvu V Tran
(74) *Attorney, Agent, or Firm*—IP & T Law Firm PLC

(57) ABSTRACT

An on-die termination includes: a code generator configured to generate a calibration code in response to a voltage of a first node and a reference voltage; a calibration resistor unit connected to the first node, and configured to be turned on and off in response to the calibration code; and a reference resistor unit coupled to the calibration resistor unit, and configured to be turned on and off in response to a control signal.

26 Claims, 17 Drawing Sheets an ON-DIE TERMINATION DEVICE

CROSS-REFERENCES TO RELATED APPLICATIONS

The present invention claims priority of Korean patent application numbers 10-2006-0080633, 10-2007-0031989 & 10-2007-0032189, filed on Aug. 24, 2006, Mar. 30, 2007 and Apr. 2, 2007, respectively, which are incorporated by reference in their entirety.

BACKGROUND OF THE INVENTION

The present invention relates to an on-die termination (ODT) device used in various kinds of semiconductor integrated circuits such as memory devices, and more particularly, to an ODT device with improved resolution.

Semiconductor devices are implemented into integrated circuit (IC) chips such as central processing units (CPUs), memories, and gate arrays, and are incorporated into a variety of electrical products such as personal computers, servers and workstations. Most of semiconductor devices include a receiving circuit configured to receive signals from an outside world via input pads and an output circuit configured to provide internal signals to an outside world via output pads.

As the operating speed of electrical products increases, a swing width of a signal exchanged between semiconductor devices gradually reduces to minimize a delay time taken for signal transmission. However, the reduction in the swing width of the signal has a great influence on an external noise, causing the signal reflectance to become more critical at an interface terminal due to an impedance mismatch. Such an impedance mismatch is generally caused by an external noise, a variation of a power voltage, a change of an operating temperature, a change of a manufacturing process, etc. The impedance mismatch may cause a difficulty in a high-speed transmission of data and a distortion in output data. Therefore, if semiconductor devices receive the distorted output signal through an input terminal, it frequently gives rise to problems such as a setup/hold failure and an error in a decision of an input level.

In particular, in order to resolve the above problems, a memory device requiring high-speed performance employs an impedance matching circuit, which is called an on-die termination (ODT), near around an input pad inside an IC chip. In a typical ODT scheme, source termination is performed by an output circuit at a transmitting end, and parallel termination is performed by a termination circuit connected in parallel with respect to a receiving circuit coupled to the input pad.

ZQ calibration refers to a procedure of generating pull-up and pull-down codes which are varied with PVT (process, voltage and temperature) conditions. The resistance of the ODT device, e.g., a termination resistance at a DQ pad in a memory device, is calibrated using the codes obtained from the ZQ calibration. Herein, the term of ZQ calibration is attributed to the fact that the calibration is performed using a ZQ node.

Hereinafter, how the ZQ calibration is performed in an ODT device will be more fully described.

FIG. 1 is a block diagram of a calibration circuit having only a pull-up resistor unit in a conventional ODT device.

The conventional calibration circuit having the pull-up resistor unit includes a comparator 102A, a counter 103A, a reference voltage generator 104A, and a pull-up resistor unit 110A configured with a plurality of parallel resistors which are turned on/off in response to pull-up calibration codes PCODE<0:N>.

The comparator 102A compares a voltage of a ZQ node and a reference voltage VREF (generally, ½VDDQ) generated from the reference voltage generator 104A with each other, thereby generating an up/down signal UP/DOWN. An external resistor 101A and the pull-up resistor unit 110A are connected to the ZQ node. Here, the external resistor 101A has a resistance of 240Ω generally, and particularly it is connected to a ZQ pad on the outside of the ZQ node chip. Therefore, the voltage of the ZQ node is determined through voltage division of the external resistor 101A and the pull-up resistor unit 110A.

The counter 103A receives the up/down signal UP/DOWN to generate the pull-up calibration codes PCODE<0:N>, and the pull-up resistor unit 110A calibrates its resistance according to the pull-up calibration codes PCODE<0:N>.

The calibrated resistance of the pull-up resistor unit 110A affects the ZQ node voltage again, and the above-described operation is then repeated until the ZQ node voltage is equal to the reference voltage VREF. Hence, the calibration is performed so that a total resistance of the pull-up resistor unit 110A is equal to that of the external resistor 101A, e.g., 240Ω in general.

The pull-up calibration codes PCODE<0:N> generated during the calibration are inputted to ODT resistors of an input buffer having the same configuration, and thus used for impedance matching.

However, in the case where the resistance of the external resistor 101A is 240Ω and a target resistance of the ODT resistor actually used in the input buffer is 60Ω (in this case, four ODT resistors which are equal to the calibration resistors are connected in parallel at the input buffer), there must be offsets between resistances of the resistors in the calibration circuit and the resistances of the resistors (i.e., ODT resistors) in the input buffer so that the ODT resistor has a resistance different from the target resistance, that is, the ODT resistor cannot have the resistance of 60Ω. Accordingly, the pull-up calibration codes PCODE<0:N> should be modified in order that the ODT resistor of the input buffer may have the target resistance.

FIG. 2 is a circuit diagram illustrating the conventional reference voltage generator 104A of FIG. 1.

The reference voltage VREF should be ½*VDDQ in general, but a switch option allows the reference voltage VREF to change from ½*VDDQ to other voltage levels, as shown in FIG. 2.

As described above, since the pull-up calibration codes PCODE<0:N> are generated by comparing the reference voltage VREF and the ZQ node voltage with each other, the pull-up calibration codes PCODE<0:N> can be different depending on the changing of the reference voltage VREF.

However, according to this conventional method, resistors included in the reference voltage generator are implemented with an active resistor, which leads to a problem in that a circuit area inevitably increases and further it is difficult to precisely calibrate an offset value, i.e., a difference from the target resistance.

FIG. 3 is a block diagram of a calibration circuit having pull-up and pull-down resistor units in a conventional ODT device.

The calibration circuit adapted to perform ZQ calibration operation includes a first pull-up resistor unit 110B, a second pull-up resistor unit 120, a pull-down drive resistor unit 130, a reference voltage generator 104B, first and second comparators 102B and 105, and pull-up and pull-down counters 103B and 106.

Because the first pull-up resistor unit 110B, the first comparator 102B, and the pull-up counter 103B are performed in the same manner as those of FIG. 1, further description for them will be omitted herein.

As illustrated in FIG. 1, the pull-up calibration codes PCODE<0:N> generated during the pull-up calibration operation are inputted to the second pull-up resistor unit 120, thus determining a total resistance of the second pull-up resistor unit 120. Then, pull-down calibration begins to perform in a manner similar to the pull-up calibration. Specifically, the pull-down calibration performs in such a manner that a voltage of a first node A is equal to the reference voltage VREF using the second comparator 105 and the pull-down counter 106, that is, the total resistance of the pull-down resistor unit 130 is equal to the total resistance of the second pull-up resistor unit 120.

The pull-up and pull-down calibration codes PCODE<0:N> and NCODE<0:N> resulted from the pull-up and pull-down calibration operations are inputted to pull-up and pull-down resistors provided at input/output pads, which are similarly configured as the pull-up and pull-down resistor units of the calibration circuit of FIG. 3, thus determining the resistance of the ODT device. In a memory device, resistances of pull-up and pull-down resistors at a DQ pad are determined.

FIGS. 4A and 4B are graphs illustrating resistance variations of a pull-up resistor unit at input/output pads versus the pull-up calibration codes PCODE<0:N> when a target resistance is set to 60Ω and 40Ω, respectively.

In FIGS. 4A and 4B, an X-axis denotes the pull-up calibration code PCODE<0:N> expressed as a decimal number equivalent to a binary pull-up calibration code, and a Y-axis denotes a resistance of a pull-up resistor unit at input/output pads in ohms.

Referring to FIGS. 4A and 4B, while the target resistances that the pull-up resistor units at the input/output pad must have are merely 60Ω and 40Ω, respectively, a width of resistance variation of the pull-up resistor unit is considerably great. The resistance of the pull-up resistor unit changes greatly as the pull-up calibration codes PCODE<0:N> change by each one level, as well.

As such, since the resistance of the pull-up resistor unit greatly changes with respect to the variation of the pull-up calibration codes PCODE<0:N>, it is difficult to accurately match the resistance of the pull-up resistor unit to the target resistance. Accordingly, there is a problem in achieving an accurate impedance matching of the ODT device, causing a speed of a semiconductor device employing the ODT device to be degraded.

Of course, it is possible to increase the resolution of the ODT device by increasing number of resistors connected to the pull-up resistor unit in parallel and more finely fractionating the pull-up calibration codes PCODE<0:N>. However, this leads to a drawback that a total circuit area must be increased, which is a trade-off relationship with high-resolution performance.

SUMMARY OF THE INVENTION

Embodiments of the present invention are directed to increasing a resolution of an on-die termination (ODT) device without the increase in a total area of the ODT device.

Embodiments of the present invention are also directed to easily compensating for an offset value, i.e., a difference between a target resistance and an actual resistance, of an ODT device within a small-sized circuit.

In accordance with an aspect of the present invention, there is provided an on-die termination, including: a code generator configured to generate a calibration code in response to a voltage of a first node and a reference voltage; a calibration resistor unit connected to the first node, and configured to be turned on and off in response to the calibration code; and a reference resistor unit coupled to the calibration resistor unit, and configured to be turned on and off in response to a control signal.

In accordance with an aspect of the present invention, there is provided an on-die termination, including: a calibration resistor unit connected to an external resistor to perform a calibration operation, and configured to generate a calibration code; and a termination resistor unit connected to an input/output pad, and configured to receive the calibration code to perform impedance matching, wherein each of the calibration and termination resistor units comprises a reference resistor that is always turned on irrespective of the calibration code when the calibration and termination resistor units operate.

DESCRIPTION OF SPECIFIC EMBODIMENTS

Hereinafter, an on-die termination (ODT) device in accordance with the present invention will be described in detail with reference to the accompanying drawings.

Figure 5:
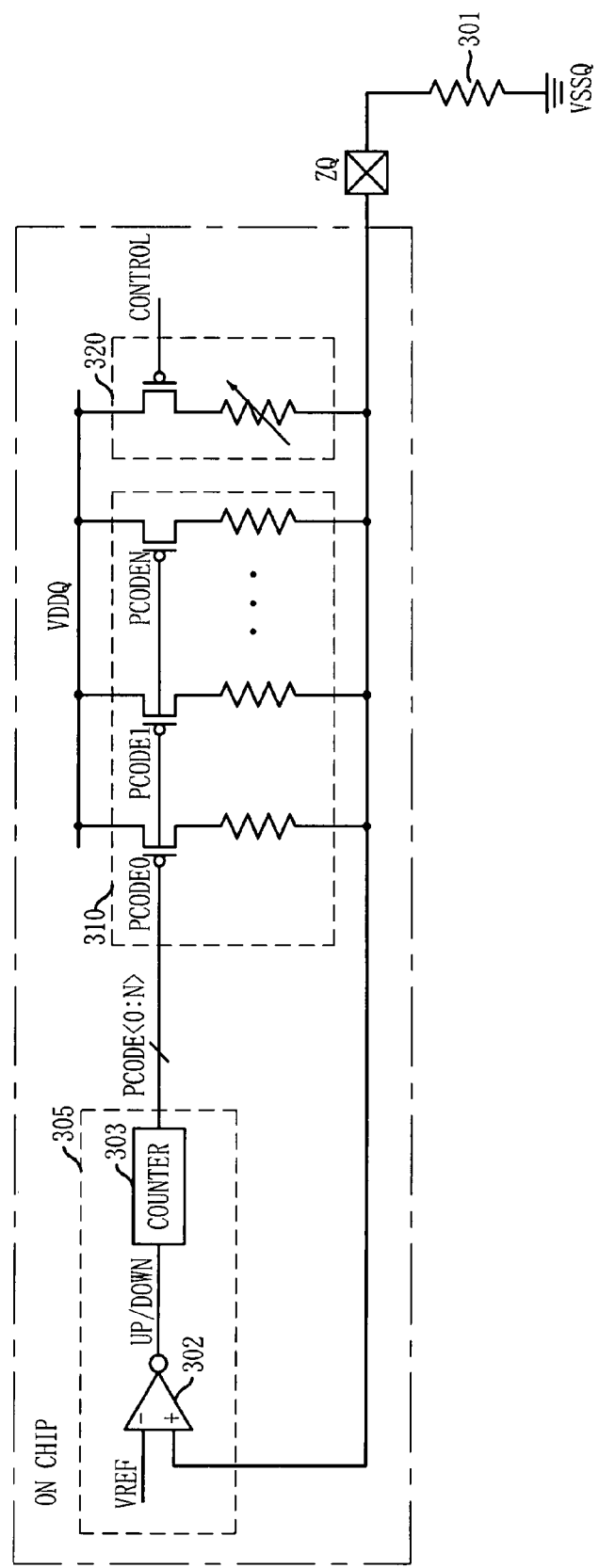
FIG. 5 is a block diagram of a calibration circuit having only a pull-up resistor unit in accordance with a first embodiment of the present invention.

FIG. 5 is a block diagram of a calibration circuit having only a pull-up resistor unit in accordance with a first embodiment of the present invention.

The calibration circuit of the ODT device in accordance with the first embodiment of the present invention includes a code generator 305, a plurality of pull-up calibration resistors 310, and a reference resistor 320.

The code generator 305 generates pull-up calibration codes PCODE<0:N> in response to a ZQ node voltage and a reference voltage VREF (generally, ½VDDQ). The code generator 305 may include a comparator 302 configured to compare the reference voltage VREF and the ZQ node voltage with each other, and a counter 303 configured to count the pull-up calibration codes PCODE<0:N> depending on the comparison result of the comparator 302.

The plurality of pull-up calibration resistors 310 are turned on/off in response to the pull-up calibration code PCODE<0:N>, and are connected to the ZQ node in parallel.

The reference resistor 320 is connected to the plurality of pull-up calibration resistors 310 in parallel, and is turned on/off in response to a control signal CONTROL. In addition, a resistance of the reference resistor 320 is variable. The control signal CONTROL turns on the reference resistor 320 when the calibration circuit is operating, and turns off the reference resistor 320 when the calibration operation is terminated.

The reason why the reference resistor 320 is used in the present invention is to constantly maintain an initial value of a total resistance of the resistors 310 and 320 in the calibration circuit and thus to increase the resolution of the calibration operation. Since the reference resistor 320 is connected to the pull-up calibration resistors 310 in parallel, a variation width of a total resistance of the resistors 310 and 320, which changes every time the pull-up calibration codes PCODE<0:N> change by each level, becomes small in comparison with the conventional one, thereby improving the resolution of the calibration operation.

The calibration circuit in accordance with the first embodiment of the present invention performs the calibration operation by comparing the ZQ node voltage and the reference voltage with each other. That is, the calibration is performed such that the total resistance of the plurality of calibration resistors 310 and the reference resistor 320 is equal to the resistance of the external resistor 301.

The resistance of the reference resistor 320 in the present invention is variable. Since the calibration is performed in such a manner that the total resistance of the reference resistor 320 and the plurality of calibration resistors 310 is equal to the resistance of the external resistor 301, the resistance of the plurality of calibration resistors 310 changes as the resistance of the reference resistor 320 varies. Here, that the resistance of the plurality of calibration resistors 310 changes means that there is a change in the pull-up calibration code PCODE<0:N>. That is, in accordance with the present invention, it is possible to change the pull-up calibration codes PCODE<0:N> by simply increasing or decreasing the resistance of the reference resistor 320.

Figure 6:
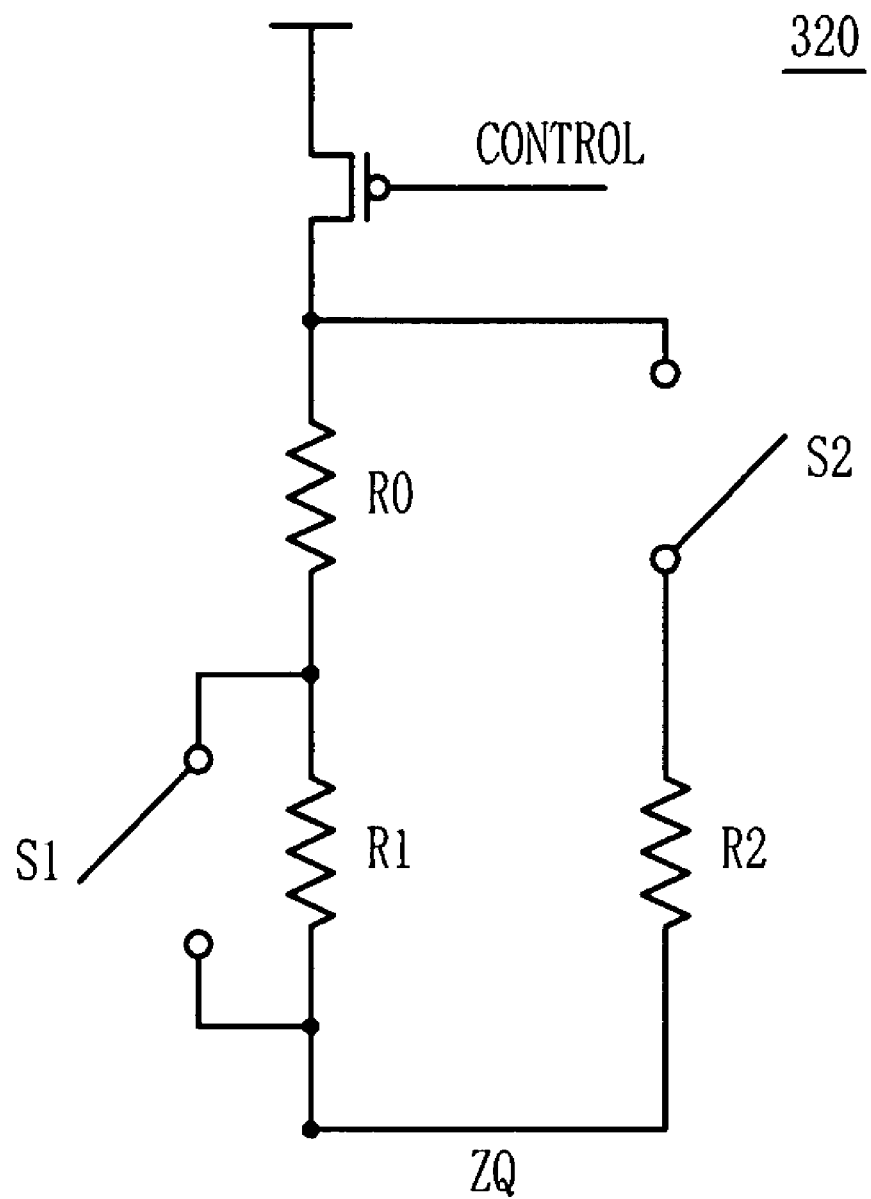
FIG. 6 is a circuit diagram illustrating a reference resistor of FIG. 5.

FIG. 6 is a circuit diagram illustrating the reference resistor 320 of FIG. 5

The reference resistor 320 may include a basic resistor R0, a parallel resistor R2 for decreasing the resistance of the reference resistor 320, and a serial resistor R1 for increasing the resistance of the reference resistor 320.

A switch S2 is connected to the parallel resistor R2 in series, and thus opens or closes the one end of the parallel resistor R2. Another switch S1 is connected to the serial resistor R1 in parallel for opening or closing both ends of the serial resistor R1.

When closing the switch S2 to connect the parallel resistor R2 to the basic resistor R0, a total resistance of the basic resistor 320 can decreases. On the contrary, when opening the other switch S1 to connect the serial resistor R1 to the basic resistor R0, it is possible to increase a total resistance of the basic resistor 320.

Although both the parallel resistor R2 and the serial resistor R1 are provided to the basic resistor R0, the reference resistor 320 may be implemented with only the parallel resistor(s) R2 or the serial resistor(s) R1.

The switches S1 and S2 can be realized with a metal option. In this case, the switches have only to be opened or closed to change the calibration codes PCODE<0:N> depending on an offset value.

Furthermore, the switches S1 and S2 may be implemented with transistors. In this case, a fuse set is included in the switch for storing logic values inputted into the transistors. That is, the fuse set is used for storing the logic value after determining whether the switches are opened or closed.

Figure 7:
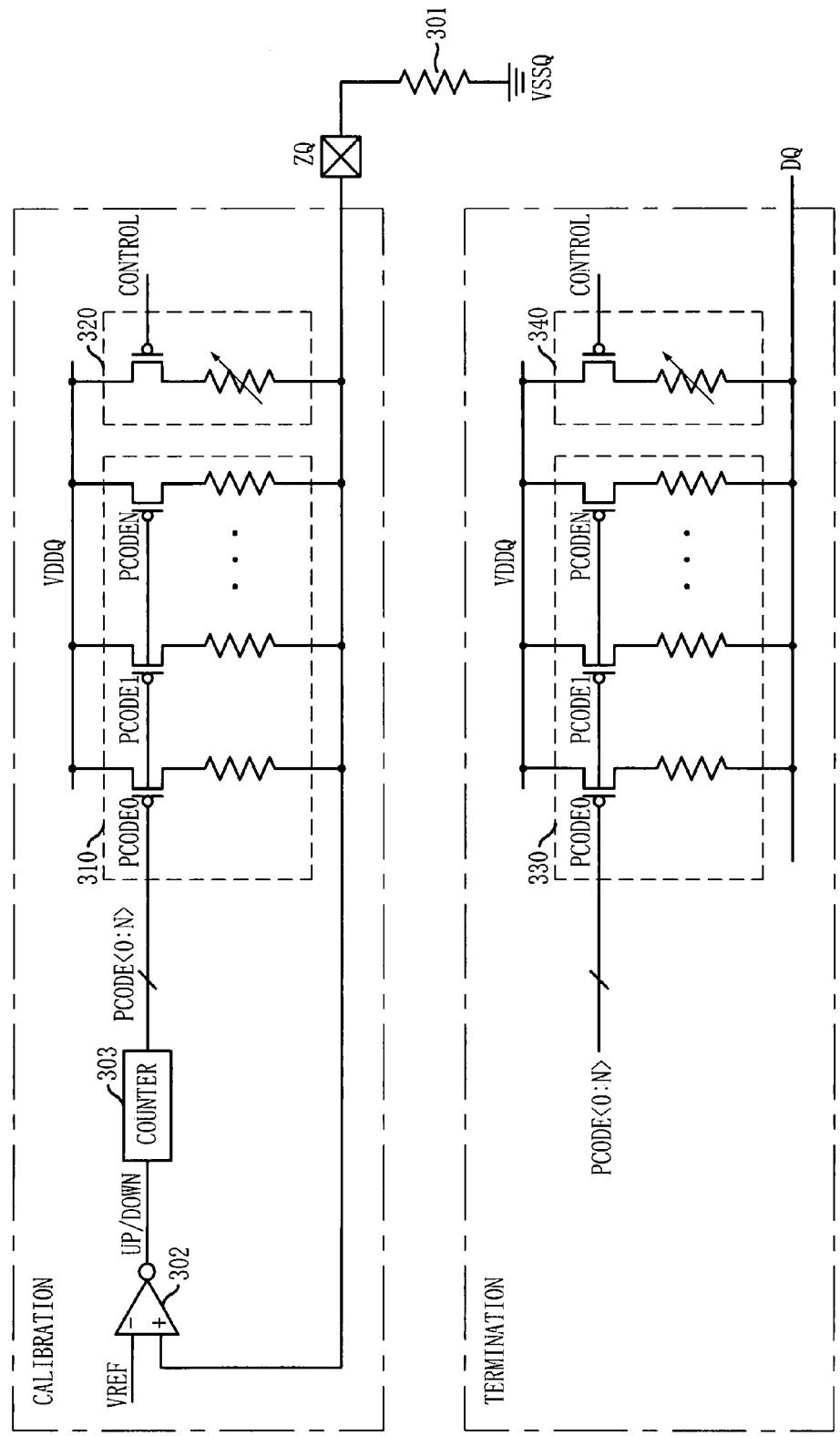
FIG. 7 is a block diagram illustrating an ODT device having the calibration circuit of FIG. 5.

FIG. 7 is a block diagram illustrating an ODT device having the calibration circuit of FIG. 5. Like reference numerals in FIG. 7 denote like elements of FIG. 5.

Although FIG. 7 illustrates an ODT device performing only pull-up termination, the ODT device may performs pull-down termination, which will also be described together below.

When the ODT device includes only one of pull-up and pull-down resistor units, i.e., when performing only one of pull-up and pull-down termination at an input buffer, the ODT device of FIG. 7 further includes a termination circuit in addition to the calibration circuit of FIG. 5. The termination circuit is provided with pull-up termination resistor unit 330 and 340 at the input/output (DQ) pad, which receives the pull-up calibration codes PCODE<0:N> to perform the impedance matching.

The pull-up termination resistor unit 330 and 340 includes a plurality of pull-up termination resistors 330 and a reference resistor 340. Herein, the plurality of pull-up termination resistor units 330 are connected to the input/output (DQ) pad in parallel, and turned on/off in response to the pull-up calibration codes PCODE<0:N>. The reference resistor 340 is connected to the plurality of pull-up termination resistors 330 in parallel, and always turned on when the ODT device operates.

As such, the present invention includes the reference resistors 320 and 340 which are always turned on during the operation of the pull-up resistor units 310/320 and 330/340 irrespective of the pull-up calibration codes PCODE<0:N>. In addition, each of the reference resistors 320 and 340 may include at least one resistor.

Meanwhile, when the ODT device performs only pull-down termination, the calibration resistor unit 310 and 320 may be configured with a pull-down resistor unit instead of the pull-up resistor unit, and the termination resistor unit 330 and 340 may be also configured with pull-down resistor unit. In this case, the external resistor 301 may be configured with a pull-up resistor instead of the pull-down resistor to directly calibrate the calibration resistor unit 310 and 320 with the external resistor 301.

Figure 8:
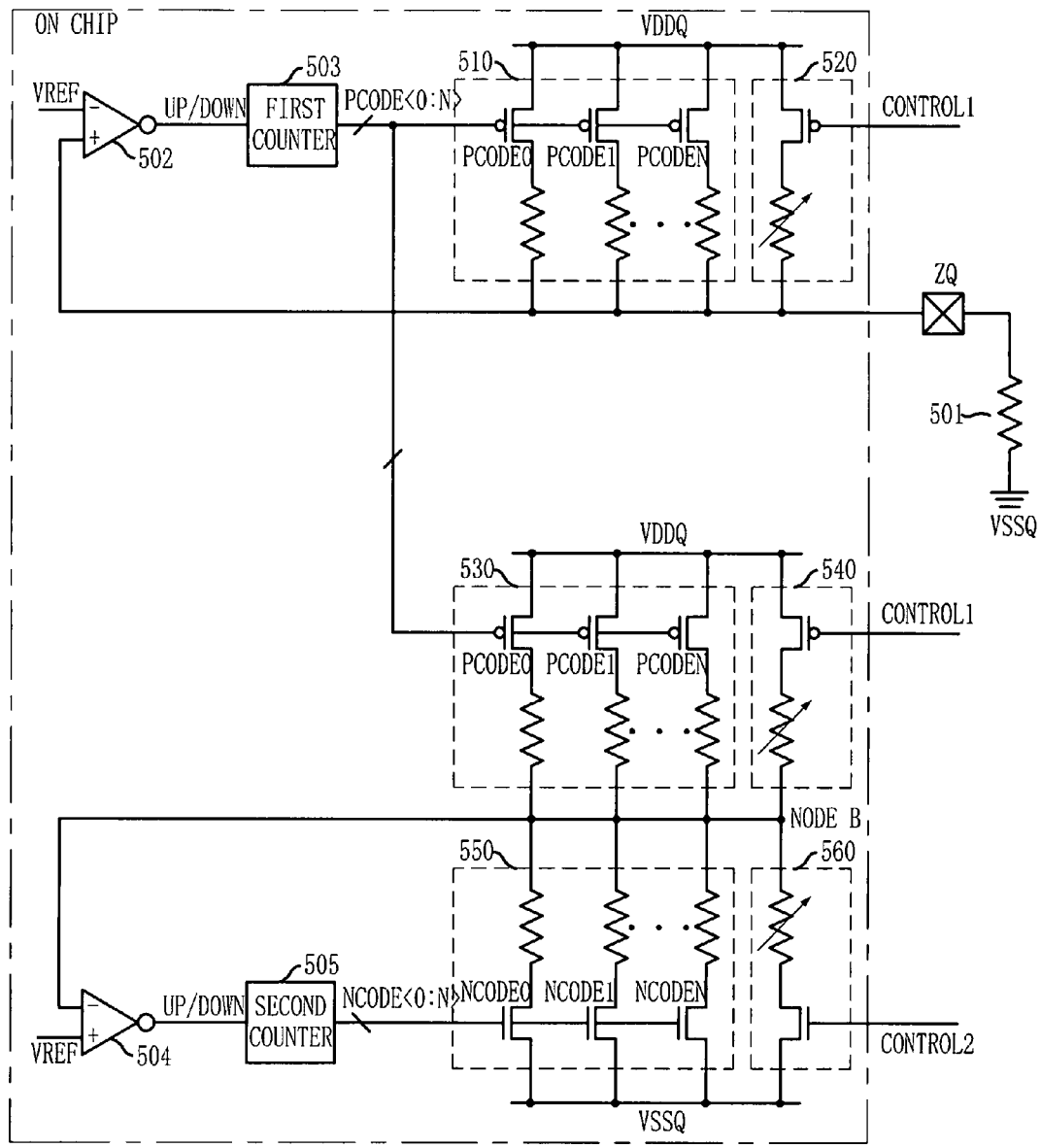
FIG. 8 is a block diagram of a calibration circuit having pull-up and pull-down resistor units in accordance with a second embodiment of the present invention.

FIG. 8 is a block diagram of a calibration circuit having pull-up and pull-down resistor units in accordance with a second embodiment of the present invention.

A calibration circuit of the ODT device in accordance with the second embodiment of the present invention includes a first code generator 502 and 503, a second code generator 504 and 505, a plurality of first pull-up calibration resistors 510, a first pull-up reference resistor 520, a plurality of second pull-up calibration resistors 530, a second pull-up reference resistor 540, a plurality of pull-down calibration resistors 550, and a pull-down reference resistor 560.

The first code generator 502 and 503 generates pull-up calibration codes PCODE<0:N> in response to a ZQ node voltage and a reference voltage VREF, and the second code generator 504 and 505 generates pull-down calibration codes NCODE<0:N> in response to a voltage of a first node NODE B and the reference voltage VREF.

More specifically, the first code generator 502 and 503 includes a first comparator 502 adapted to compare the reference voltage VREF and the ZQ node voltage with each other, and a first counter 503 adapted to count the pull-up calibration codes PCODE<0:N> depending on the comparison result of the first comparator 502. The second code generator 504 and 505 may include a second comparator 504 adapted to compare the reference voltage VREF and the voltage of the first node NODE B with each other, and a second counter 505 adapted to count the pull-down calibration codes NCODE<0:N> depending on the comparison result of the second comparator 504.

The plurality of first pull-up calibration resistors 510 are connected to the ZQ node in parallel, and turned on/off in response to the pull-up calibration code PCODE<0:N>. The first pull-up reference resistor 520 is connected to the plurality of first pull-up calibration resistors 510 in parallel, and turned on/off in response to a first control signal CONTROL1. Here, the resistance of the first pull-up resistor unit 520 is variable. The first control signal CONTROL1 turns on the first pull-up reference resistor 520 only when the pull-up calibration is performed.

The plurality of second pull-up calibration resistors 530 are connected to the first node NODE B in parallel, and turned on/off in response to the pull-up calibration codes PCODE<0: N>. That is, the plurality of second pull-up resistors 530 have the same configuration and structure as the plurality of the first pull-up calibration resistors 510 except that the former are connected to the first node NODE B. The second pull-up calibration resistors 530 are used for calibration of the pull-down calibration resistors 550, i.e., used for calibration so as to generate the pull-down codes. The second pull-up reference resistor 540 is connected to the plurality of second pull-up calibration resistors 530 in parallel, and turned on/off in response to the first control signal CONTROL1. Here, the resistance of the second pull-up reference resistor 540 is variable. That is, the second pull-up reference resistor 540 is the same as the first pull-up reference resistor 520 except that the former is connected to the first node NODE B instead of the ZQ node.

The plurality of pull-down calibration resistors 550 are connected to the first node NODE B in parallel, and turned on/off in response to the pull-down calibration codes NCODE<0:N>. Thus, the pull-down calibration is performed to generate the pull-down calibration codes NCODE<0:N> using the plurality of pull-down calibration resistors 550. The pull-down reference resistor 560 is connected to the plurality of pull-down calibration resistors 550 in parallel, and turned on/off in response to a second control CONTROL2. Likewise, the resistance of the pull-down reference resistor 560 is variable. The second control signal CONTROL2 turns on the pull-down reference resistor 560 only when the pull-down calibration is performed. The first and second control signals CONTROL1 and CONTROL2 are similar to each other because they turn on the reference resistors 520, 540 and 560 during the calibration operation. However, the first control signal CONTROL1 is different from the second control signal CONTROL2 in that the first control signal CONTROL1 is inputted to a PMOS transistor and the second control signal CONTROL2 is inputted to an NMOS transistor. As will be more fully described later, it is possible to change the pull-down calibration codes NCODE<0:N> by varying the resistance of the pull-down reference resistor 560.

As for an overall operation of the ODT device in accordance with the second embodiment, the calibration is performed in such manner that a total resistance of the plurality of first pull-up calibration resistors 510 and the first pull-up reference resistor 520 is equal to the resistance of the external resistor 501, thus generating the pull-up calibration codes PCODE<0:N> (pull-up calibration). The plurality of pull-up calibration codes PCODE<0:N> are inputted to the plurality of second pull-up calibration resistors 530. The plurality of second pull-up calibration resistors 530 and the second pull-up reference resistor 540 have the same configuration and structure except that their locations are different. Accordingly, the total resistance of the plurality of second pull-up calibration resistors 530 and the second pull-up reference resistor 540 is also equal to the resistance of the external resistor 501.

The calibration for generating the pull-down calibration codes NCODE<0:N> is also the same as the pull-up calibration except that the voltage of the first node NODE B and the reference voltage VREF are compared with each other. Therefore, the total resistance of the plurality of second pull-up calibration resistors 530 and the second pull-up reference resistor 540 is equal to the total resistance of the plurality of pull-down calibration resistors 550 and the pull-down reference resistor 560. That is, the total resistance of the plurality of pull-down calibration resistors 550 and the pull-down reference resistor 560 is also equal to the resistance of the external resistor 501. At this time, the pull-down calibration codes NCODE<0:N> are generated.

As similar to the first embodiment, the pull-up calibration codes PCODE<0:N> may change if the resistance of the first pull-up reference resistor 520 and the second pull-up reference resistor 540 changes. It is noticed that the first pull-up reference resistor 520 and the second pull-up resistor unit 540 are equally changed because they should be equal to each other. By using the change in the pull-up calibration code PCODE<0:N>, it is possible to compensate for an offset value that occurs in a pull-up resistor of an output driver.

In addition, if the resistance of the pull-down reference resistor 560 changes, the pull-down calibration codes NCODE<0:N> also change, which makes it possible to compensate for an offset value that occurs in the pull-down resistor of the output driver.

It is impossible to respectively change the pull-up calibration codes PCODE<0:N> and the pull-down calibration codes NCODE<0:N> using the conventional ODT device using a method of changing the reference voltage VREF. In the present invention, however, the pull-up calibration codes PCODE<0:N> and the pull-down calibration codes NCODE<0:N> can change respectively according to which resistor changes among the reference resistors 520, 540 and 560.

Since the changing procedure of the resistances of the reference resistors 520, 540 and 560 may be performed in the same manner as described already in FIG. 6, further description for it will be omitted herein.

The reason the reference resistors are not simply connected in parallel but controlled by the first control signal CONTROL1 or the second control signal CONTROL2 is that the ODT device does not always perform the pull-up and pull-down termination operations even though the ODT device includes all the resistors for pull-up and pull-down termination. For example, in a semiconductor memory device, the ODT device performs only pull-up termination when it works as an input buffer at a DQ pad, but performs both pull-up and pull-down terminations when it works as an output driver. Furthermore, because the ODT device does not always perform the termination operation even though the memory device includes the ODT device, the reference resistor is implemented such that it is controlled by the first control signal CONTROL1 or the second control signal CONTROL2 in the present invention.

The present invention is directed to changing the calibration codes PCODE<0:N> and NCODE<0:N> by changing the resistance of the reference resistor 520, 540 and 560 instead of changing the reference voltage VREF. Therefore, the present invention may also be used together with the conventional method of changing the reference voltage VREF, and does not exclude the conventional method.

Figure 9:
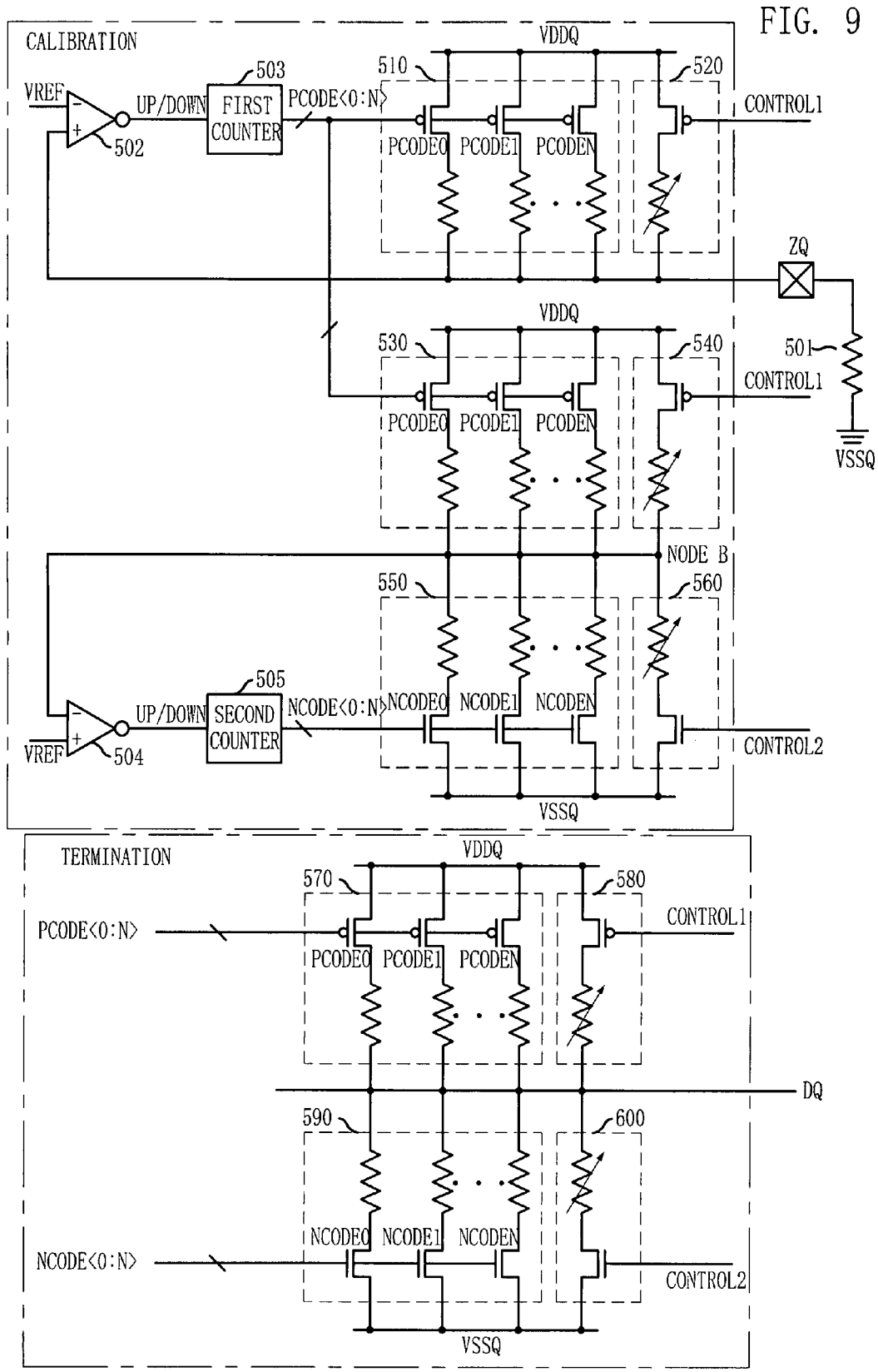
FIG. 9 is a block diagram illustrating an ODT device having the calibration circuit of FIG. 8.

FIG. 9 is a block diagram illustrating an ODT device having the calibration circuit of FIG. 8. Like reference numerals in FIG. 9 denote like elements of FIG. 8.

The ODT device of FIG. 9 further includes a termination circuit in addition to the calibration circuit of FIG. 8. The termination circuit includes a pull-up termination resistor unit 570 and 580 adapted to receive the pull-up calibration codes PCODE<0:N> at the input/output (DQ) pads to perform the impedance matching, and a pull-down termination resistor unit 590 and 600 adapted to receive the pull-down calibration codes NCODE<0:N> at the input/output (DQ) pads to perform the impedance matching.

The termination resistor units 570/580 and 590/600 include reference resistors 580 and 600, respectively, which are always turned on during operation of the ODT device irrespective of the calibration codes PCODE<0:N> and NCODE<0:N>. Furthermore, each of the reference resistors 580 and 600 may include one resistor or more.

Therefore, the total resistance of the resistor units 510+520, 550+560, 570+580, and 590+600, which changes every time the pull-up and pull-down calibration codes PCODE<0:N> and NCODE<0:N> change by one level, changes much smaller than the convention ODT device. The reference resistors 520, 560, 580 and 600 are always turned on when the ODT device operates, making it possible to improve the resolution of the ODT device.

In addition, because the reference resistors 520, 560, 580 and 600 are provided, the present invention is also advantageous in that initial values of the resistor units 510+520, 550+560, 570+580 and 590+600 of the ODT device can be maintained constantly.

The reference resistors 520, 560, 580 and 600 of the present invention are controlled by the first control signal CONTROL1 or the second control signal CONTROL2. In detail, the first control signal CONTRO1 turns on both the reference resistor 520 in the pull-up calibration resistor unit 510+520 and the reference resistor 580 in the pull-up termination resistor unit 570+580 when the ODT device performs the pull-up termination operation. On the contrary, the second control signal CONTRO2 turns on both the reference resistor 560 in the pull-down calibration resistor unit 550+560 and the reference resistor 600 in the pull-down termination resistor unit 590+600 when the ODT device performs the pull-down termination operation.

The pull-down calibration operation for generating the pull-down calibration codes NCODE<0:N> using the pull-down calibration resistor unit 550+560 may be performed such that the pull-down calibration resistor unit 550+560 is not directly calibrated with the external resistor 501 but the pull-down calibration resistor unit 550+560 is calibrated with the external resistor 501 via the second pull-up calibration resistor unit 530+540 having the same configuration as the first pull-up calibration resistor unit 510+520.

Figure 10A:
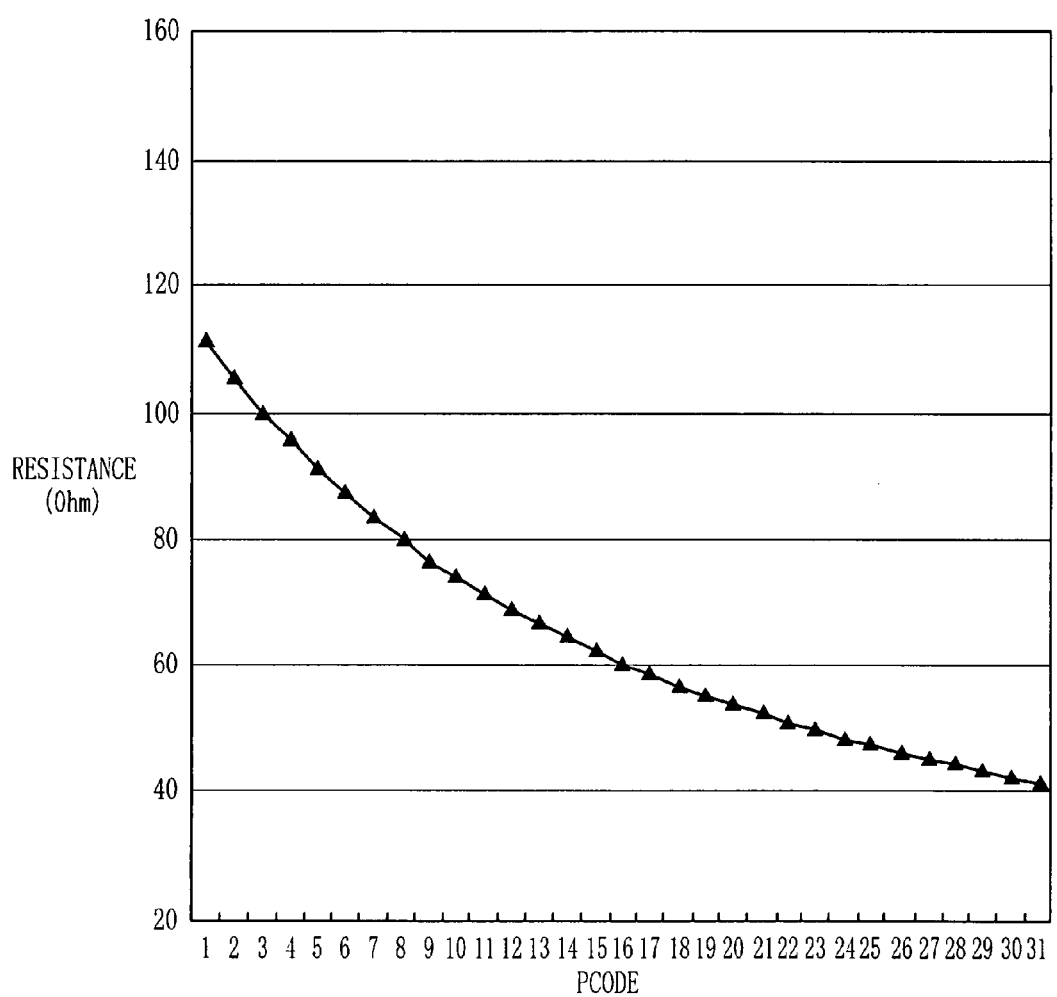
FIGS. 10A and 10B are graphs illustrating resistance variations of a pull-up termination resistor unit versus pull-up calibration codes in the ODT device of FIG. 9 when a target resistance is set to 60Ω and 40Ω, respectively.
Figure 10B:
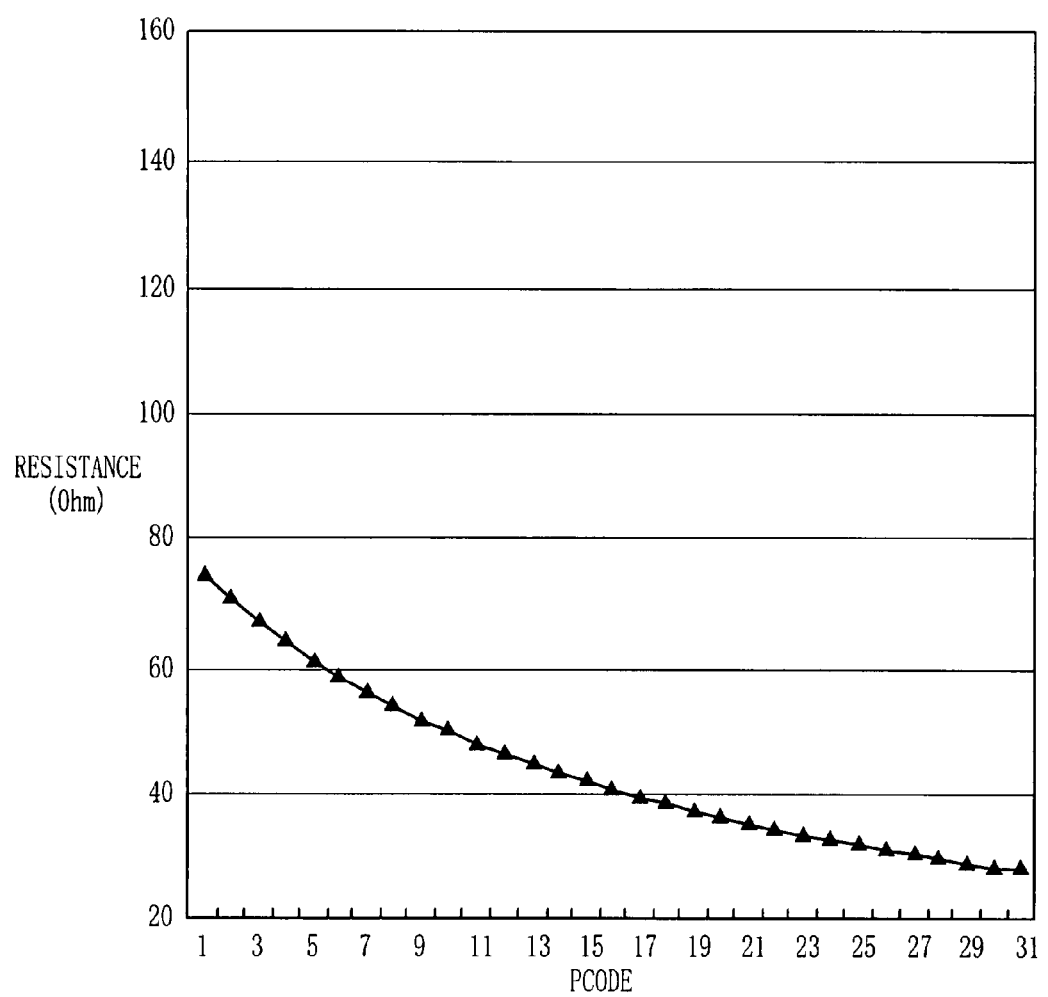

FIGS. 10A and 10B are graphs illustrating resistance variations of a pull-up termination resistor unit versus the pull-up calibration code in the ODT device of FIG. 9 when a target resistance is set to 60Ω and 40Ω, respectively.

Figure 1:
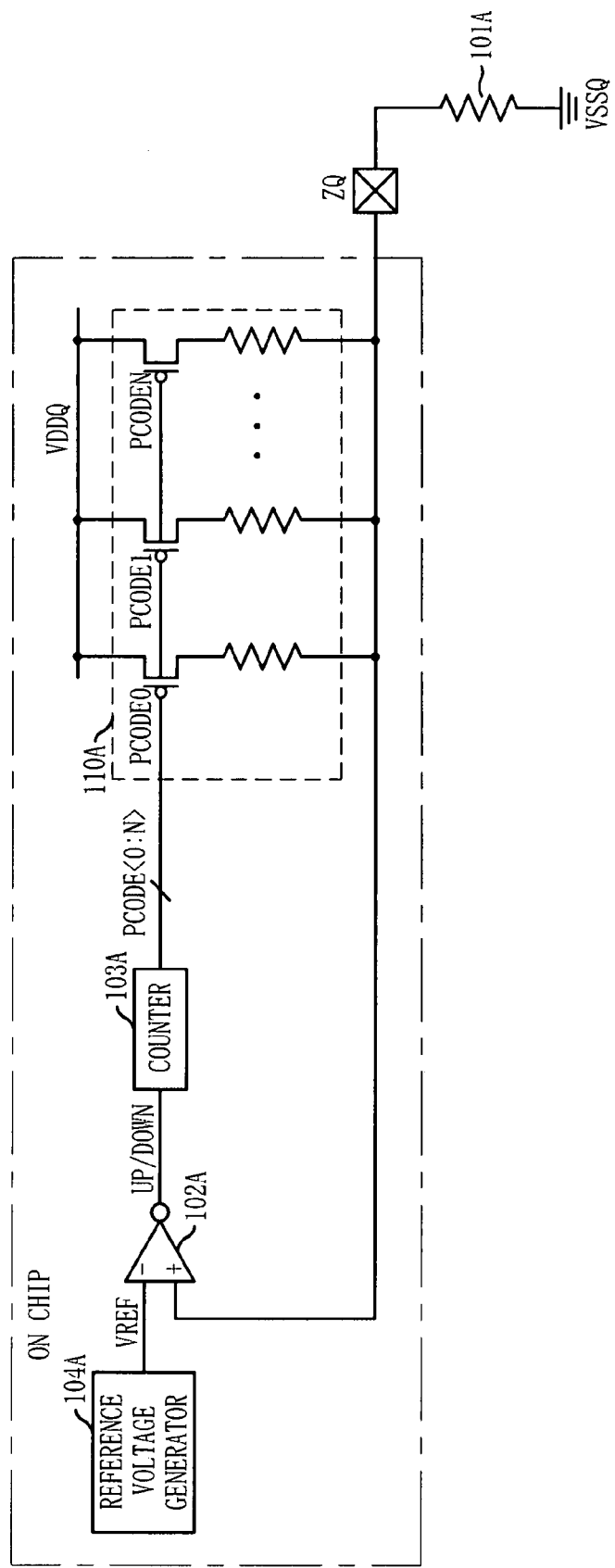
FIG. 1 is a block diagram of a calibration circuit having only a pull-up resistor unit in a conventional on-die termination (ODT) device.
Figure 2:
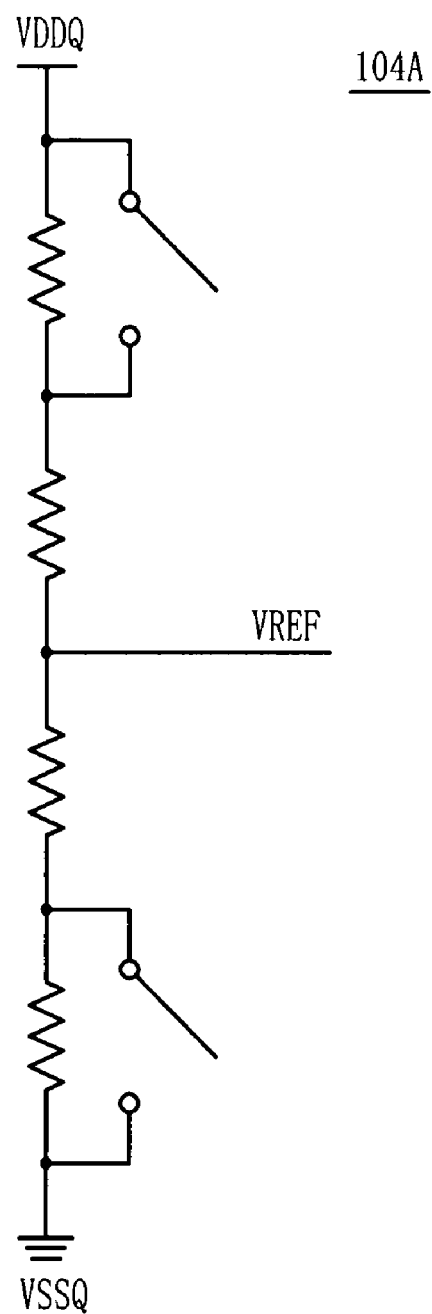
FIG. 2 is a circuit diagram illustrating a conventional reference voltage generator of FIG. 1.
Figure 3:
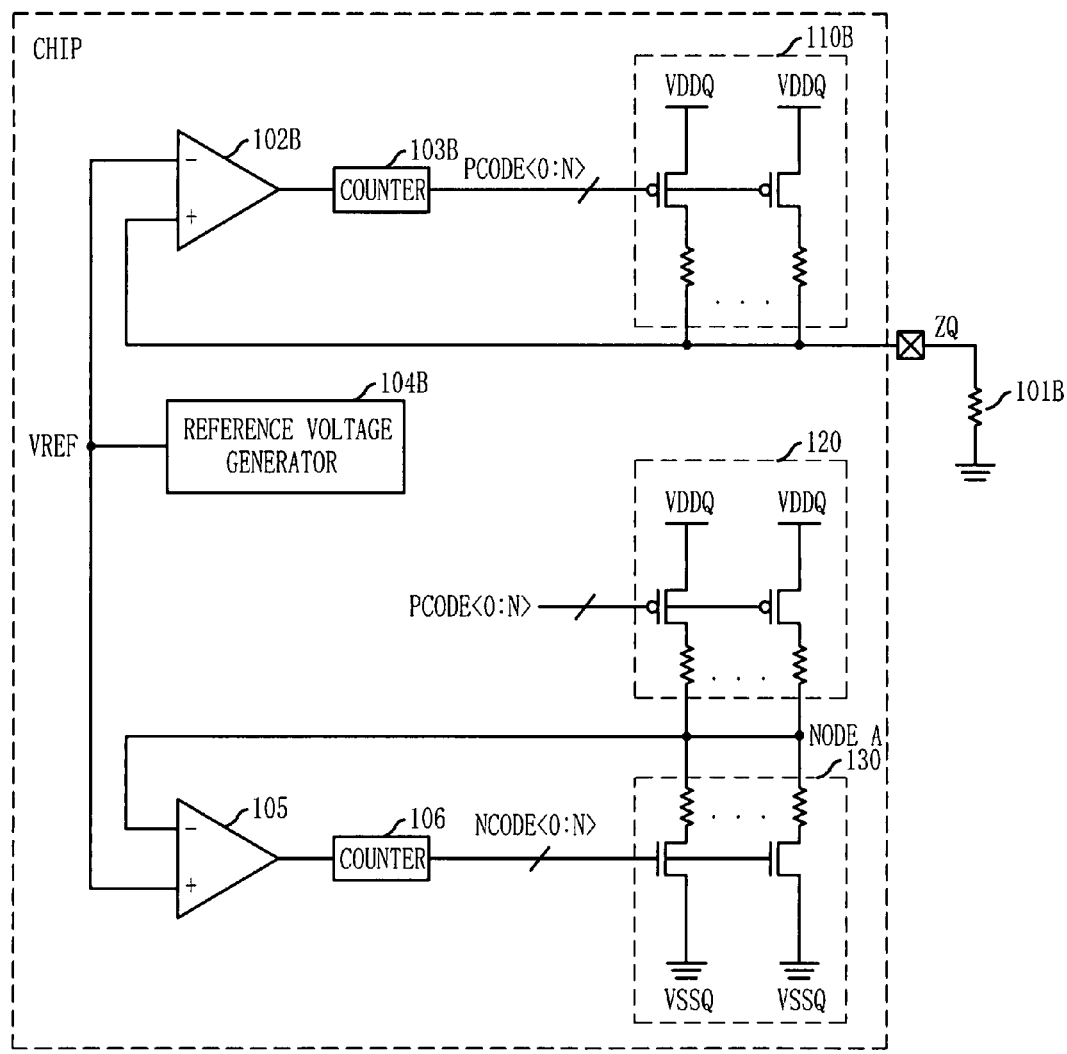
FIG. 3 is a block diagram of a calibration circuit having pull-up and pull-down resistor units in a conventional ODT device.
Figure 4A:
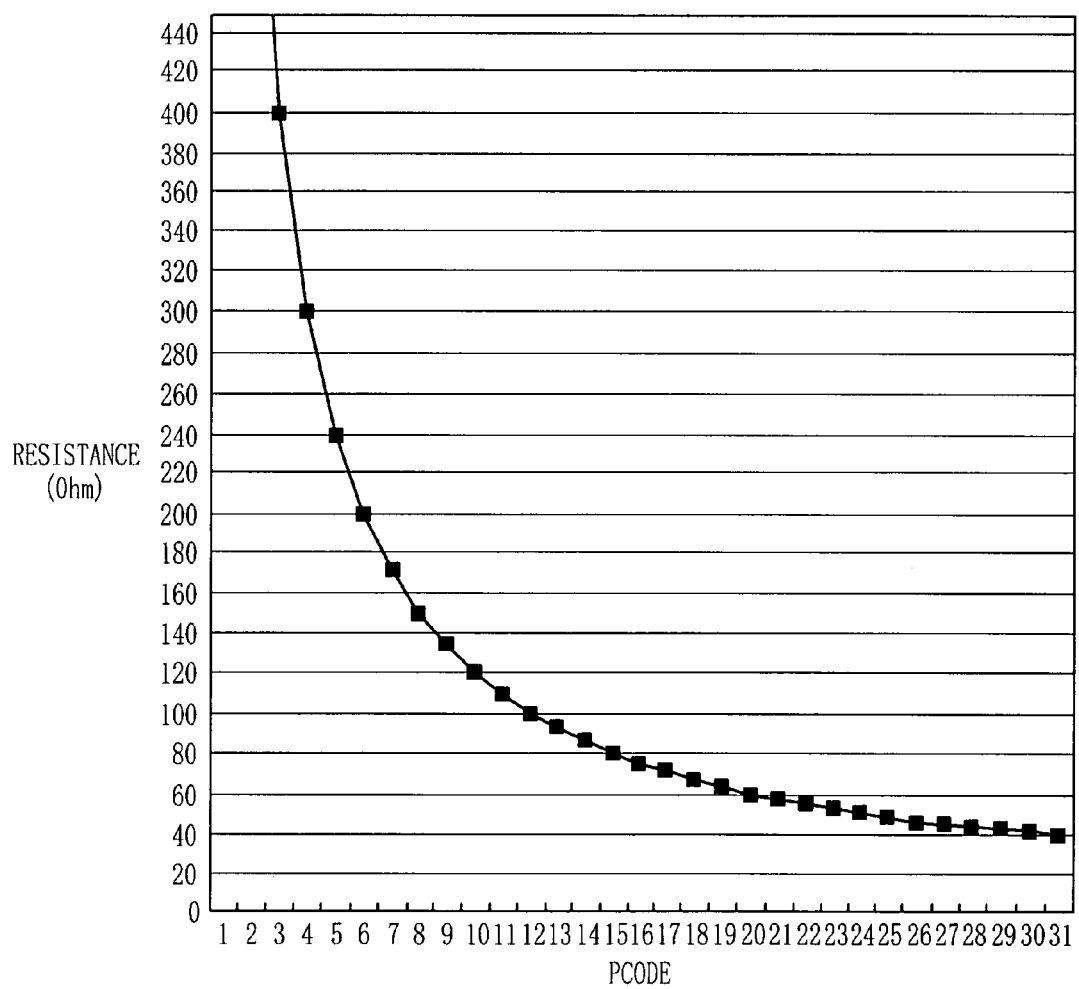
FIGS. 4A and 4B are graphs illustrating resistance variations of a pull-up resistor unit at input/output pads versus pull-up calibration codes when a target resistance is set to 60Ω and 40Ω, respectively.
Figure 4B:
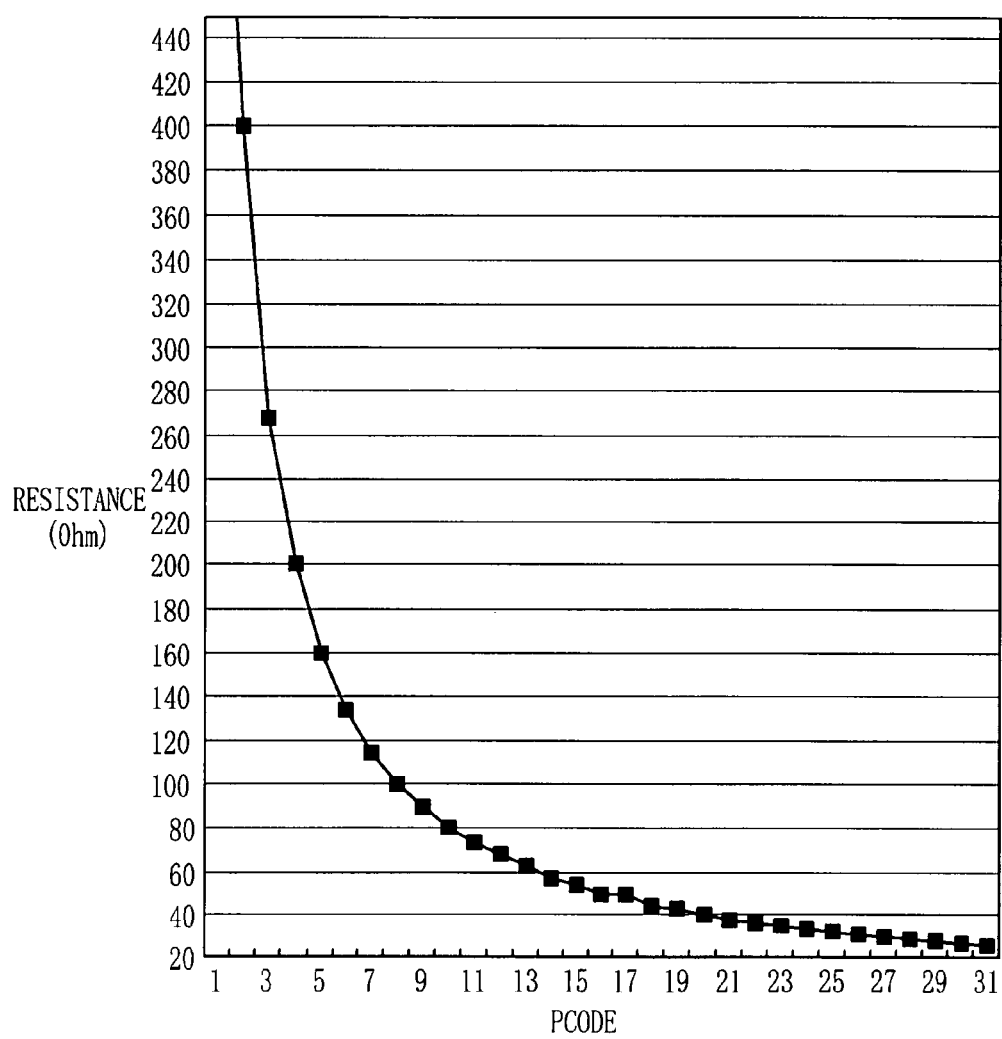

It can be observed that the resistance of the pull-up termination resistor unit 570+580 approximate to almost target value, i.e., 60Ω or 40Ω, because a resistance variation per one code is extremely small, which is significantly different from the conventional results of FIGS. 4A and 4B. Although only the resistance variation of the pull-up termination resistor unit 570+580 is illustrated in FIGS. 9A and 9B, it is apparent that result of the pull-down termination resistor unit 590+600 is also the same as the above because the same technical ideas of the present invention are also applied to the pull-down termination resistor unit 590+600.

The ODT termination device as described in FIGS. 5 to 9 can operate by itself without any malfunction. However, for application to specific conditions, a supplementary circuit is needed, which will be described below.

In a package burn-in test of a memory device using the ODT device, when the termination resistance of the input buffer is small due to a limitation in the use amount of current in a test apparatus, the current consumption of commonly-inputted command and address pins increases, causing normal mode register set (MRS) input to be impossible. Therefore, to allow the termination resistor to have a total resistance of 10 kΩ or higher, the external resistor connected to the ZQ pad is designed to have the resistance of 10 kΩ or higher, and the calibration resistor is calibrated to have the resistance of 10 kΩ or higher. Accordingly, the termination resistor can also have a high resistance as the calibration resistor has the high resistance.

As described above, however, in the case where the calibration resistors and the termination resistors have the reference resistors which are always turned on when the ODT device operates, it is impossible to set the total resistance of the resistors to a high value, e.g., 10 kΩ, owing to the presence of the basic resistor.

Accordingly, during specific processes such the package burn-in test, it is necessary to implement a supplementary circuit which is used for setting the termination resistance of the ODT device to a high value.

Figure 11:
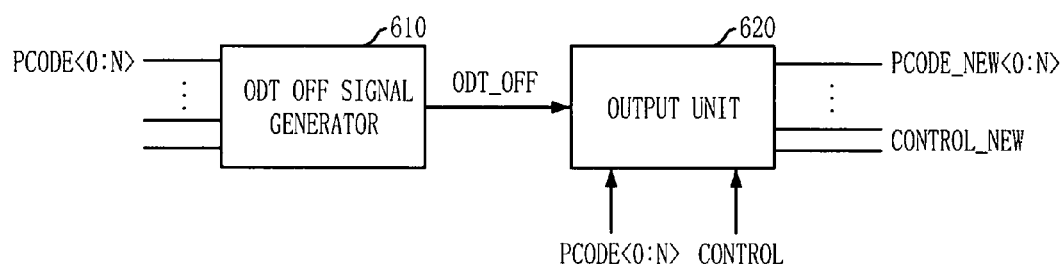
FIG. 11 is a block diagram of a supplementary circuit that allows the ODT device in accordance with the present invention to have very high termination resistance.

FIG. 11 is a block diagram of a supplementary circuit that allows the ODT device in accordance with the present invention to have very high termination resistance.

The ODT device in accordance with an embodiment of the present invention, which can have very high resistance, includes an ODT off signal generator 610 adapted to generate an ODT off signal ODT_OFF when the external resistor connected to the ZQ node has a high resistance, and an output unit 620 adapted to turn off all the resistors in the calibration and termination resistor units in response to the ODT off signal ODT_OFF. Herein, the ODT device generates the calibration codes through the calibration resistor unit at the ZQ node, and inputs the calibration codes to the termination resistor unit at the input/output pad to achieve impedance matching. The resistor unit is provided with at least one reference resistor which is controlled by the control signal and always turned on during the operation of the ODT device.

The ODT off signal generator 610 generates an ODT off signal ODT_OFF when the external resistor (301 of FIGS. 5 and 7, or 501 of FIGS. 8 and 9) has a high resistance. Herein, the case that the external resistor has a high resistance means that the calibration code PCODE<0:N> is set such that all the resistors under control of the calibration code PCODE<0:N> are turned off due to the high resistance of the external resistor. That is, when the external resistor has the highest resistance among resistance values that the calibration and termination resistors may have through the calibration, the ODT off signal generator 610 generates the ODT off signal ODT_OFF.

The output unit 620 receives the ODT off signal ODT_OFF to control the resistor units, and particularly turns off all the resistors in the resistor unit when the ODT off signal is activated. Here, all the resistor units include resistors controlled by the calibration codes PCODE<0:N> and at least one reference resistor which is always turned on in response to the control signal CONTROL during the operation of the ODT device.

For reference, although there are shown the pull-up calibration and termination of FIGS. 5 and 7, these are merely exemplarily illustrated, and thus the ODT off signal generator 610 and the output unit 620 can also be applied to pull-down calibration and termination.

Figure 12:
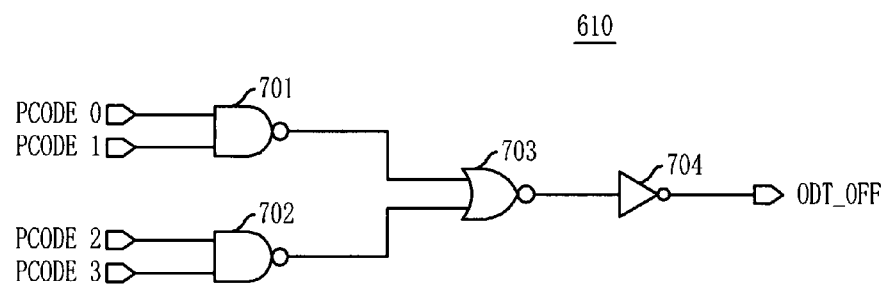
FIG. 12 is a circuit diagram illustrating an ODT off signal generator of FIG. 11.

FIG. 12 is a circuit diagram illustrating the ODT off signal generator 610 of FIG. 11.

Referring to FIG. 12, the ODT off signal generator 610 may include two NAND gates 701 and 702, a NOR gate 703, and an inverter 704.

The ODT off signal generator 610 activates the ODT off signal ODT_OFF to be a logic low level when all the calibration codes PCODE<0:3> turn off the resistors under control thereof, that is, when all the calibration codes PCODE<0:3> become logic high levels.

As for the operation of the ODT off signal generator 610, when all the calibration codes PCODE<0:3> of logic high levels are inputted, the two NAND gates 701 and 702 output signals of logic low levels, respectively. The NOR gate 703 then performs a logic NOR operation on the output signals of the two NAND gates 701 and 702 to thereby output a signal of logic high level. The inverter 704 inverts the output signal of NOR gate 703 to output the ODT off signal ODT_OFF of logic low level. When one of the calibration codes PCODE<0:3> has a logic low level, the ODT off signal becomes logic high level so that the ODT off signal ODT_OFF is deactivated.

Although the ODT off signal generator 610 of FIG. 12 is simply configured with the NAND gates and the NOR gate, various modifications can be possible using other logic gates.

Furthermore, though FIG. 12 shows the ODT off signal generator 610 applied to the pull-up part, the ODT off signal generator 610 is applicable to the pull-down part. In this case, the pull-down calibration codes NCODE<0:3> should be used instead of the pull-up calibration codes PCODE<0:3>, and a slight modification should be made such that the ODT off signal ODT_OFF is activated when all the pull-down calibration codes NCODE<0:3> have a logic low level. Further description for them will be omitted herein because such modification is obvious to those skilled in the art.

Figure 13:
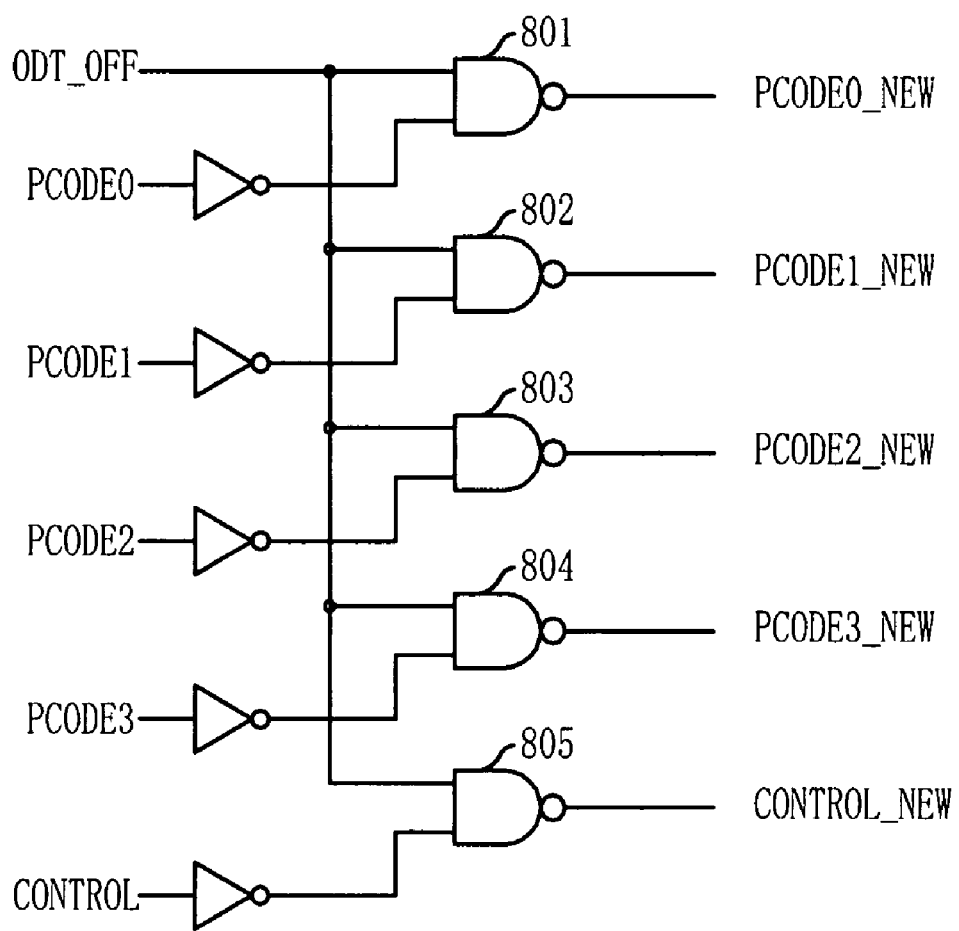
FIG. 13 is a circuit diagram illustrating an output unit of FIG. 11.

FIG. 13 is a circuit diagram illustrating the output unit 620 of FIG. 11.

The output unit 620 outputs all the calibration codes PCODE<0:3> of logic high levels and the control signal CONTROL of logic high level, thus turning off all the resistors in the resistor unit, when the ODT off signal ODT_OFF is activated to logic low level. That is, the calibration codes PCODE<0:3> and the control signal CONTROL are not directly inputted to the calibration and termination resistor units, but adjusted calibration codes PCODE_NEW<0:3> and an adjusted control signal CONTROL_NEW outputted from the output unit 620 are inputted to the calibration and termination resistor units instead.

As illustrated in FIG. 13, the output unit 620 may include a plurality of NAND gates 801~805 adapted to receive the ODT off signal ODT_OFF, and inverted signals of the calibration codes PCODE<0:3> and the control signal CONTROL.

As for the operation of the output unit 620, when the ODT off signal ODT_OFF is activated to a logic high level, the same signals as the calibration codes PCODE<0:3> and the control signal CONTROL are outputted as the adjusted calibration codes PCODE_NEW<0:3> and the adjusted control signal CONTROL_NEW so that the output unit 620 operates in the same manner as the conventional one.

However, when the ODT off signal ODT_OFF which is deactivated to a logic low level is inputted to one terminal, the NAND gates 801~805 respectively outputs the adjusted calibration codes PCODE_NEW<0:3> of a logic high level and the adjusted control signal CONTROL_NEW of a logic high level irrespective of which signal is inputted to the other terminal. Accordingly, all the resistors in the calibration and termination resistor units are turned off, which makes it possible for the ODT device to have a very high resistance.

Although the exemplary embodiment illustrates that the output unit 620 of FIG. 13 is applied to the pull-up resistor unit, it can be also applied to the pull-down resistor unit. In this case, the output unit 620 may be designed to output all logic 'LOW' signals when the ODT off signal ODT_OFF is generated. Further description for it will be omitted herein because such modification is obvious to those skilled in the art.

Figure 14:
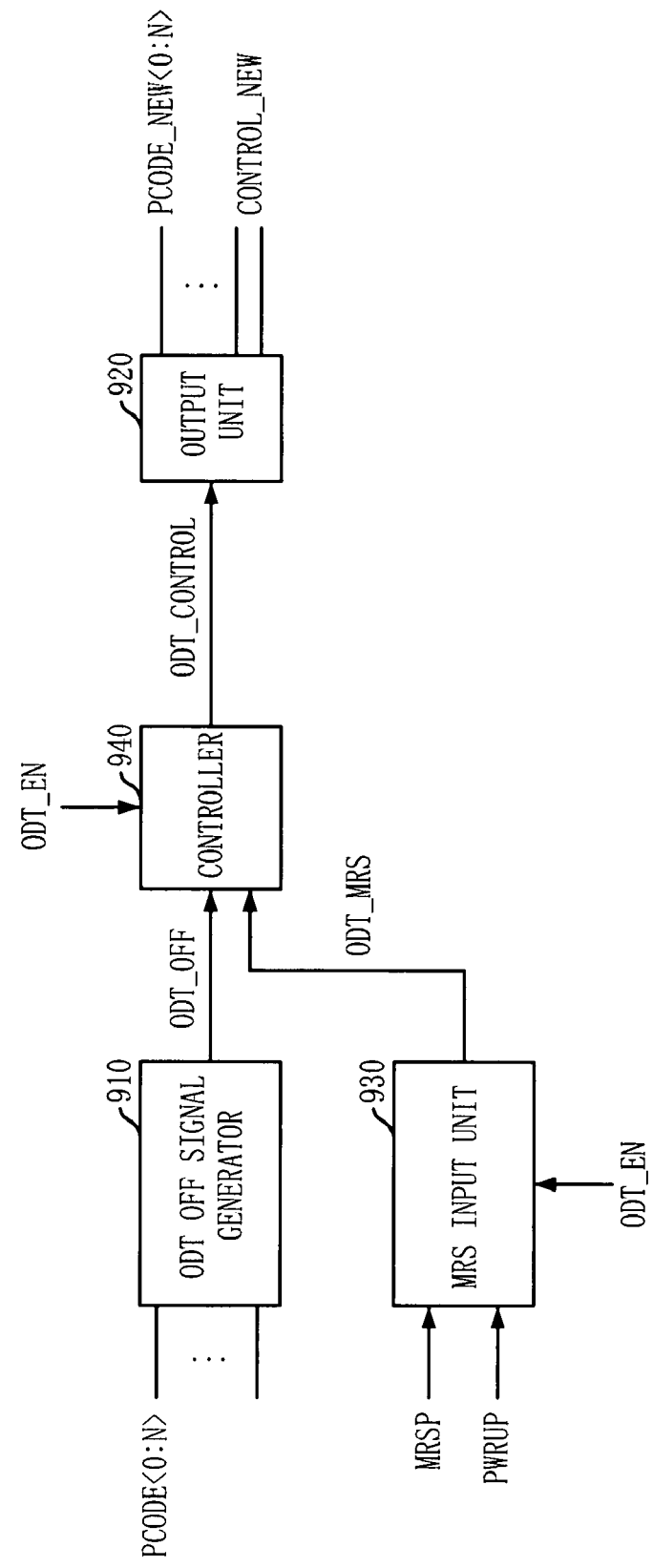
FIG. 14 is a block diagram of supplementary circuits adapted to receive commands set by a mode register set (MRS), in addition to the construction of FIG. 11.

FIG. 14 is a block diagram of supplementary circuits adapted to receive commands set by a mode register set (MRS), in addition to the construction of FIG. 11.

The ODT devices illustrated in FIGS. 11 to 13 turn off all the resistors of the calibration and termination resistor units in the ODT device when the ODT off signal ODT_OFF is generated, thereby stopping the calibration operation. Therefore, it is impossible to enable the calibration operation with MRS set inputs. In the embodiment of FIG. 14, however, it is possible to enable the calibration or termination operation with MRS inputs even though the calibration or termination operation of the ODT device is turned off due to the ODT off signal ODT_OFF. That is, this embodiment illustrates that a normal MRS set command can control the calibration operation of the ODT device preferentially.

As shown in FIG. 14, the ODT device in accordance with an embodiment of the present invention for additionally receiving commands set by the MRS, includes an ODT off signal generator 910, an MRS input unit 930, a controller 940, and an output unit 920. The ODT off signal generator 910 generates an ODT off signal ODT_OFF when the external resistor connected to the ZQ node has a high resistance. The MRS input unit 930 receives an MRS pulse MRSP and an ODT enable signal ODT_EN to output an MRS signal ODT_MRS. The controller 940 outputs an ODT control signal ODT_CONTROL for turning off or enabling the calibration and termination resistor units in response to the ODT enable signal ODT_EN, the ODT off signal ODT_OFF and the MRS signal ODT_MRS. The output unit 920 controls the calibration and termination resistor units in response to the ODT control signal ODT_CONTROL.

Because the ODT off signal generator 910 in FIG. 14 is the same as the ODT off signal generator 610 illustrated in FIGS. 11 and 12, further description for it will be omitted herein. In addition, the output unit 920 in FIG. 14 has the same configuration as the output unit 620 of FIGS. 11 and 13 except that the output unit 920 in FIG. 14 receives the ODT control signal ODT_CONTROL whereas the output unit 620 of FIG. 13 receives the ODT off signal ODT_OFF.

Figure 15:
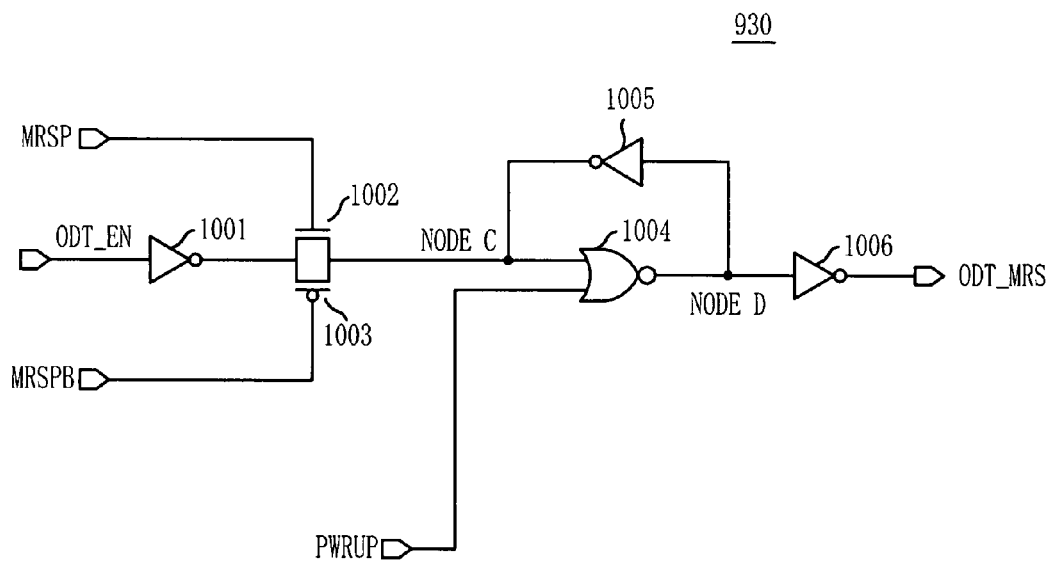
FIG. 15 is a circuit diagram illustrating an MRS input unit of FIG. 14.

FIG. 15 is a circuit diagram illustrating the MRS input unit 930 of FIG. 14.

The MRS input unit 930 receives an ODT enable signal ODT_EN enabling the operation of the ODT device by MRS setting when the MRS pulse MRSP, which is inputted every time the MRS set value changes, is inputted thereto. In addition, the MRS input unit 930 latches the inputted signal.

As shown in FIG. 15, the MRS input unit 930 includes an inverter 1001, two transistors 1002 and 1003, a NOR gate 1004, an inverter 1005, and an inverter 1006. The inverter 1001 inverts an ODT enable signal ODT_EN. The two transistors 1002 and 1003 transfer the output signal of the inverter 1001 when the MRS pulse MRSP is inputted. The NOR gate 1004 receives the signal transferred from the two transistors 1002 and 1003 and a power-up signal PWRUP. The inverter 1005 is connected to the NOR gate 1004 to latch a signal. The inverter 1006 inverts the output of the NOR gate 1004.

As for the operation of the MRS input unit 930, when the MRS pulse of logic high level is inputted (MRSP='HIGH', MRSPB='LOW'-this signal is an inverted signal of MRSP), the transistors 1002 and 1003 are turned on so that the ODT enable signal ODT_EN is inverted and transferred to the first node NODE C. Since the power-up signal PWRUP is activated only in an initial stage of power-up mode, the NOR gate 1004 inverts the signal of the first node NODE C after the initial stage of the power-up mode and then transferred to the second node NODE D. At this time, the inverter 1005 latches the signal of the first node NODE C. Lastly, the inverter 1006 inverts the signal of the second node NODE D to output the MRS signal ODT_MRS.

That is, the MRS is set to enable the ODT device. Specifically, when the ODT enable signal ODT_EN of logic high level is inputted and the MRS pulse MRSP is inputted, the MRS signal ODT_MRS of logic low level is outputted finally. On the other hand, when the ODT enable signal ODT_EN of logic low level is inputted and the MRS pulse MRSP is inputted, the MRS signal ODT_MRS of logic high level is outputted finally.

For reference, the reason why the NOR gate 1004 receives the power-up signal PWRUP is to set the MRS signal ODT_MRS to logic high level at the initial stage of the power-up mode.

Figure 16:
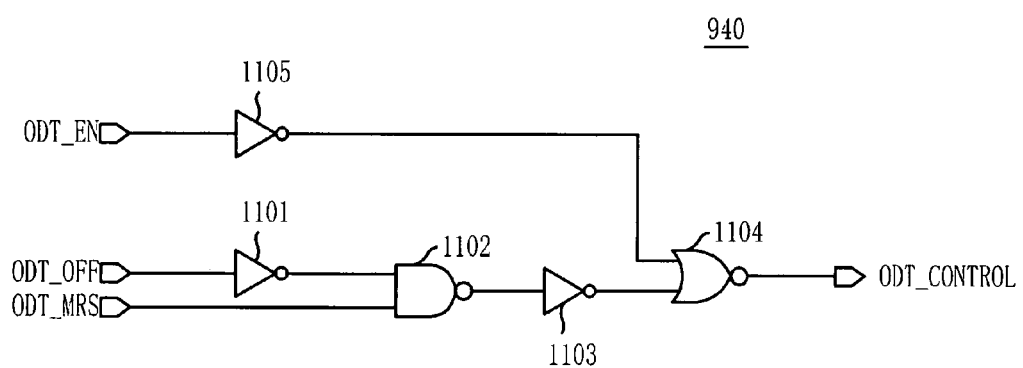
FIG. 16 is a circuit diagram illustrating a controller of FIG. 14.

FIG. 16 is a circuit diagram illustrating the controller 940 of FIG. 14.

The controller 940 outputs a signal for turning off all the resistors of the calibration and termination resistor units in the ODT device when the ODT off signal generator 910 generates the ODT off signal ODT_OFF. However, the controller 940 outputs a signal for enabling the calibration and termination operations of the ODT device irrespective of the ODT off signal ODT_OFF when the ODT enable signal ODT_EN is inputted to the MRS input unit 930.

As shown in FIG. 16, the controller 940 may include an inverter 1101 adapted to invert the ODT off signal ODT_OFF, a NAND gate 1102 adapted to perform a logic NAND operation on the output of the inverter 1101 and the MRS signal ODT_MRS, an inverter 1103 adapted to invert the output of the NAND gate 1102, and a NOR gate 1104 adapted to perform a logic NOR operation on the output of the inverter 1103 and the inverted signal of the ODT enable signal ODT_EN.

As for the operation of the controller 940, the MRS signal ODT_MRS of logic high level is inputted initially in a state when the MRS pulse is not inputted. The ODT off signal ODT_OFF generated by the calibration operation is activated to logic low level. Accordingly, the output signal of the NAND gate 1102 becomes logic low level and the output signal of the NOR gate 1104 becomes logic low level, thus turning off all the resistors in the calibration and termination resistor units.

When the calibration and termination operations of the ODT device are enabled again by the MRS input, the ODT enable signal ODT_EN of logic high level is inputted into the inverter 1105, and the MRS signal ODT_MRS of logic low level is inputted into one terminal of the NAND gate 1102 as the MRS pulse MRSP is inputted. Therefore, the output signal of the NAND gate 1102 becomes a logic high level, and thus the output signal ODT_CONTROL of the NOR gate 1104 becomes a logic high level. Accordingly, since the output signal of the NOR gate 1104, i.e., the ODT control signal ODT_CONTROL, of logic high level is inputted to the output unit 920, it is possible to perform a normal operation by enabling the ODT device again by means of the MRS input even after the ODT off signal ODT_OFF has been generated.

Figure 17:
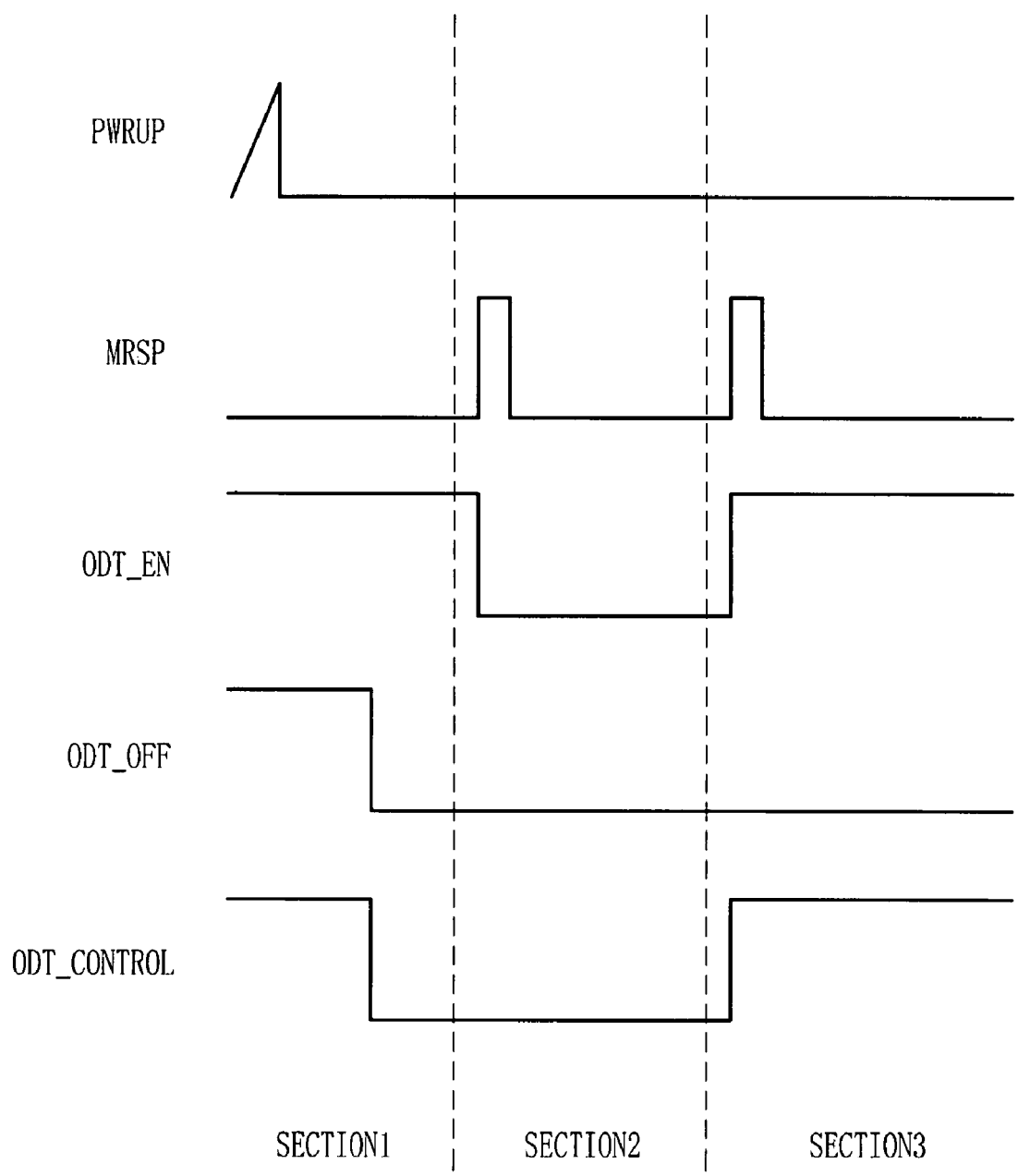
FIG. 17 is a timing diagram of signals in the ODT device illustrated in FIGS. 11 to 16.

FIG. 17 is a timing diagram of signals in the ODT device illustrated in FIGS. 14 to 16.

In a first section SECTION1, the ODT control signal ODT_CONTROL becomes a logic high level at the initial stage of the power-up mode so that a normal calibration is performed. However, when the ODT off signal ODT_OFF is generated (ODT_OFF='LOW') during the calibration operation, the ODT control signal ODT_CONTROL becomes a logic low level so that all the resistors in the calibration and termination resistor units are turned off via the output unit 920.

In a second section SECTION2, the MRS pulse MRSP is inputted under the condition that the MRS is set to disable the ODT device, and thus the ODT enable signal ODT_EN becomes a logic low level. However, the ODT enable signal of logic low level has no effect because the ODT control signal ODT_CONTROL has become a logic low level already.

In a third section SECTION3, when the MRS pulse MRSP is inputted under the condition that the MRS is set to enable the ODT device and thus the ODT enable signal ODT_EN becomes logic high level, the ODT control signal ODT_CONTROL becomes logic high level in spite of the ODT off signal ODT_OFF of logic low level, thereby enabling the operation of the ODT device.

In accordance with the present invention, since the calibration and termination resistor units of the ODT device has at least one reference resistor, it is advantageous in that resolution of the ODT device is improved. In addition, the initial value of the ODT device can be maintained constantly in virtue of the reference resistor which is always turned on.

Furthermore, it is possible to change the calibration code by simply changing the resistance of the reference resistor. Therefore, in the case where the resistance of the ODT device at the input buffer or the output driver is offset from a target value, it is possible to simply compensate for an offset value.

While the conventional ODT device using the method of changing the reference voltage requires a relatively large circuit area because an active resistor is employed, the present invention provides an advantageous merit that the pull-up and pull-down calibration codes can be simply changed within a small circuit area.

In addition, unlike the conventional ODT device using the method of changing the reference voltage, the ODT device of the present invention provides another advantage that it is possible to separately control the pull-up calibration code and the pull-down calibration code, that is, it is possible to compensate for pull-up and pull-down offsets separately.

In the case where the ODT device of the present invention is implemented with the ODT off signal generator and the output unit, it can be applied to a burn-in test requiring very high termination resistance. Moreover, when the MRS input unit and the controller are further provided to the present invention, it is possible to enable the ODT device under control of the MRS input.

While the present invention has been described with respect to the specific embodiments, it will be apparent to those skilled in the art that various changes and modifications may be made without departing from the spirit and scope of the invention as defined in the following claims.

What is claimed is:

1. An on-die termination (ODT) device, comprising:
   a code generator configured to generate a calibration code in response to a voltage of a first node and a reference voltage;
   a calibration resistor unit connected to the first node, and configured to be turned on and off in response to the calibration code; and
   a reference resistor unit coupled to the calibration resistor unit, and configured to be turned on or off in response to a control signal,
   wherein the calibration resistor unit has a plurality of calibration resistors and the reference resistor unit maintains a parallel connection with the calibration resistor unit during a calibration operation of the plurality of calibration resistors.

2. The ODT device as recited in claim 1, wherein the control signal is controlled to turn on the reference resistor unit during the calibration operation and turn off the reference resistor unit when the calibration operation is terminated.

3. The ODT device as recited in claim 1, wherein the reference resistor unit is provided singularly or in plurality.

4. The ODT device as recited in claim 1, wherein the reference resistor unit comprises:
   a basic resistor;
   a parallel resistor connected to the basic resistor in parallel; and
   a switch configured to open or close one end of the parallel resistor.

5. The ODT device as recited in claim 1, wherein the reference resistor unit comprises:
   a basic resistor;
   a serial resistor connected to the basic resistor in series; and
   a switch configured to open or close both ends of the serial resistor.

6. The ODT device as recited in claim 1, wherein the reference resistor unit comprises:
   a basic resistor;
   a serial resistor connected to the basic resistor in series;
   a parallel resistor connected to the basic resistor in parallel; and
   switches configured to open or close both ends of the serial resistor and one end of the parallel resistor, respectively.

7. The ODT device as recited in claim 6, wherein the switch is provided with a metal option.

8. The ODT device of claim 6, wherein the switch comprises:
   a transistor configured to perform a switching operation; and
   a fuse set configured to store a logic value inputted into the transistor.

9. The ODT device as recited in claim 1, wherein the code generator comprises:
   a comparator adapted to compare the reference voltage and the voltage of the first node with each other; and
   a counter adapted to count the calibration code depending on the comparison result of the comparator.

10. The ODT device as recited in claim 1, wherein the calibration operation is performed such that a total resistance of the calibration resistor unit and the reference resistor unit are equal to a resistance of an external resistor.

11. The ODT device as recited in claim 1, wherein the ODT device performs a pull-up termination operation.

12. The ODT device as recited in claim 1, wherein the ODT device performs a pull-down termination operation.

13. An on-die termination (ODT) device, comprising:
    a calibration unit connected to an external resistor to perform a calibration operation and generate a calibration code; and
    a termination unit connected to an input/output pad, and configured to receive the calibration code to perform impedance matching,
    wherein each of the calibration and termination units comprises a reference resistor that is turned on irrespective of the calibration code when the calibration and termination units operate,
    wherein each of the calibration and termination units further includes a plurality of resistors connected in parallel and configured to turn on/off in response to the calibration code,
    wherein each of the reference resistors maintains a parallel connection with the plurality of resistors during a calibration operation of the plurality of resistors.

14. The ODT device as recited in claim 13, wherein the reference resistor is provided singularly or in plurality.

15. The ODT device as recited in claim 13, wherein the calibration and termination units operate as a pull-up resistor.

16. The ODT device as recited in claim 13, wherein the calibration and termination units operate as a pull-down resistor.

17. The ODT device as recited in claim 13, wherein the reference resistor comprises:
    a basic resistor;
    a serial resistor connected to the basic resistor in series;
    a parallel resistor connected to the basic resistor in parallel; and
    switches configured to open and close both ends of the serial resistor and one end of the parallel resistor, respectively.

18. The ODT device as recited in claim 13, further comprising:
    an ODT off signal generator adapted to generate an ODT off signal when the external resistor has a high resistance; and
    an output unit adapted to turn off all the resistors in the calibration unit and the termination unit in response to the ODT off signal.

19. The ODT device as recited in claim 18, wherein the ODT off signal generator activates the ODT off signal when the calibration code turns off all the resistors under control of the calibration code.

20. The ODT device as recited in claim 18, wherein, when the ODT off signal is activated, the output unit turns off all the resistors in the calibration unit and the termination unit by adjusting the calibration code and a control signal controlling the reference resistor.

21. The ODT device as recited in claim 13, further comprising:
    an ODT off signal generator configured to activate an ODT off signal when the external resistor has a high resistance;
    a mode register set (MRS) input unit configured to receive an ODT enable signal set by an MRS to output an MRS signal;
    a controller configured to output an ODT control signal for turning off or enabling the calibration unit and the termination unit in response to the ODT off signal and the MRS signal; and
    an output unit configured to control the calibration unit and the termination unit in response to the ODT control signal.

22. The ODT device as recited in claim 21, wherein the ODT off signal generator activates the ODT off signal when the calibration code turns off all the resistors under control of the calibration code.

23. The ODT device as recited in claim 21, wherein the MRS input unit receives the ODT enable signal when an MRS pulse is inputted.

24. The ODT device as recited in claim 23, wherein the MRS input unit latches the inputted ODT enable signal to output the MRS signal.

25. The ODT device as recited in claim 21, wherein the controller outputs an ODT control signal that turns off all the resistors in the calibration unit and the termination unit when the ODT off signal is activated, and
    the ODT controller outputs an ODT control signal that enables the calibration unit and the termination unit when the ODT enable signal is inputted to the MRS input unit.

26. The ODT device as recited in claim 21, wherein the output unit turns off all the resistors in the calibration unit and the termination unit by adjusting the calibration code and a control signal controlling the reference resistor when receiving the ODT control signal, which turns off the resistors, from the controller, and
    the output unit controls the calibration unit and the termination unit so as to perform a normal calibration operation when the ODT control signal for enabling the calibration and termination units is inputted.

* * * * *